United States Patent
Ikeda et al.

(10) Patent No.: US 8,574,993 B2
(45) Date of Patent: Nov. 5, 2013

(54) SEMICONDUCTOR DEVICE AND METHOD OF MANUFACTURING THE SAME

(75) Inventors: Keiji Ikeda, Yokohama (JP); Tsutomu Tezuka, Yokohama (JP); Yoshihiko Moriyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/422,985

(22) Filed: Mar. 16, 2012

(65) Prior Publication Data

US 2012/0175705 A1 Jul. 12, 2012

Related U.S. Application Data

(63) Continuation of application No. PCT/JP2009/066162, filed on Sep. 16, 2009.

(51) Int. Cl.
*H01L 21/336* (2006.01)

(52) U.S. Cl.
USPC .................................. 438/305; 257/E21.409

(58) Field of Classification Search
USPC ......................................................... 438/305
See application file for complete search history.

(56) References Cited

U.S. PATENT DOCUMENTS

| | | | |
|---|---|---|---|
| 7,390,707 B2 * | 6/2008 | Kawamura et al. | 438/197 |
| 2004/0183142 A1 | 9/2004 | Matsuo et al. | |
| 2010/0035399 A1 * | 2/2010 | Rachmady et al. | 438/299 |

FOREIGN PATENT DOCUMENTS

| JP | 63-060525 | 3/1988 |
|---|---|---|
| JP | 2000-223703 | 8/2000 |
| JP | 2003-324078 | 11/2003 |
| JP | 2005-167249 | 6/2005 |
| JP | 2006-100600 | 4/2006 |
| JP | 2007-142036 | 6/2007 |
| JP | 2007-214481 | 8/2007 |
| JP | 2008-004776 | 1/2008 |

OTHER PUBLICATIONS

Lindert et al.; "Quasi-Planar FinFETs with Selectively Grown Germanium Raised Source/Drain", 2001 IEEE International SOI Conference, Oct. 2001, pp. 111-112, (2001).

Li et al.; "Interfacial Reaction Between a Ni/Ge Bilayer and silicon (100)", Journal of Applied Physics, vol. 67, No. 5, pp. 2506-2511, (1990).

International Search Report from the Japanese Patent Office for International Application No. PCT/JP2009/066162, mailing date Dec. 28, 2009.

English translation of International Preliminary Report on Patentability from the Japanese Patent Office for International Application No. PCT/JP2009/066162, mailing date Apr. 11, 2012.

First Office Action from Japanese Patent Office for Japanese Patent Application No. 2011-531698, mailed on Jun. 4, 2013 (5 pages).

* cited by examiner

*Primary Examiner* — Charles Garber
*Assistant Examiner* — Reema Patel
(74) *Attorney, Agent, or Firm* — Finnegan, Henderson, Farabow, Garrett & Dunner, LLP

(57) ABSTRACT

According to one embodiment, a method of manufacturing a MOS semiconductor device. In the method, a gate electrode is formed on a gate insulating film provided on a channel region which is a part of an Si layer and which is interposed between a source/drain region, and a film mainly includes of Ge is made to grow on the source/drain region. Then, and the film mainly includes of Ge is made to react with a metal, forming an intermetallic compound film having a depthwise junction position identical to a growth interface of the film mainly includes of Ge.

12 Claims, 15 Drawing Sheets

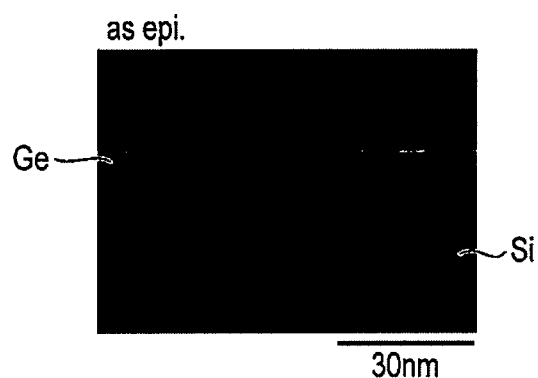
F I G. 2A
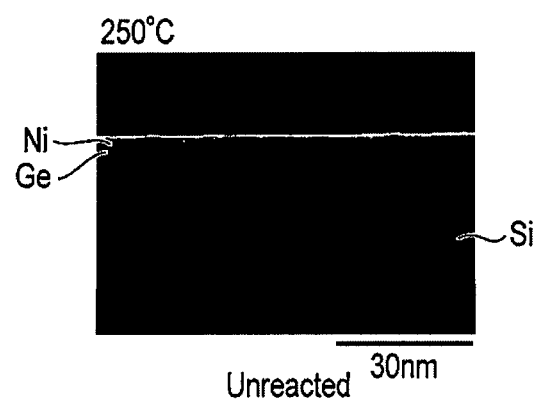
F I G. 2B
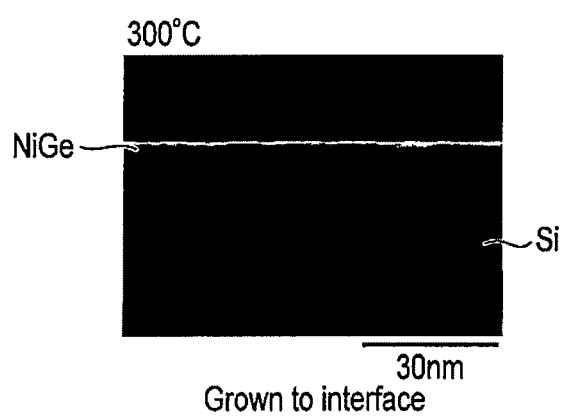
F I G. 2C
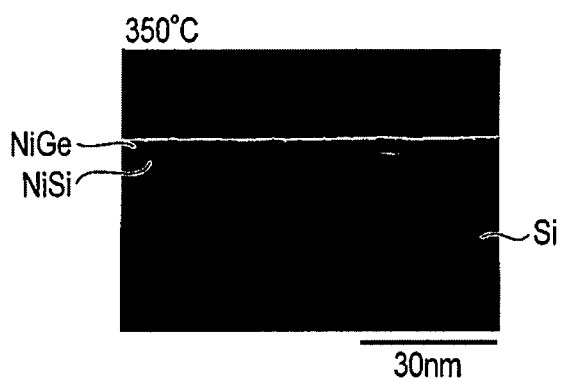
F I G. 2D

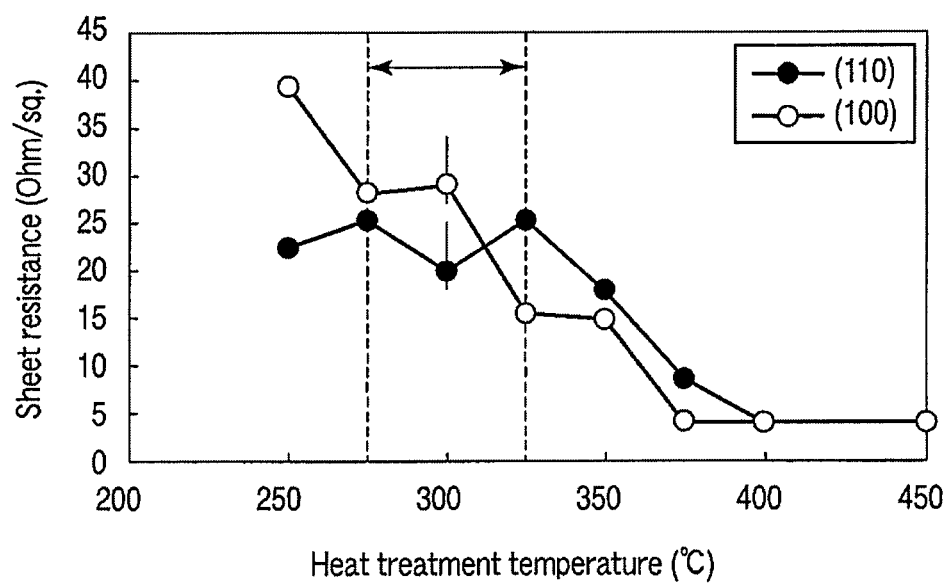
F I G. 3

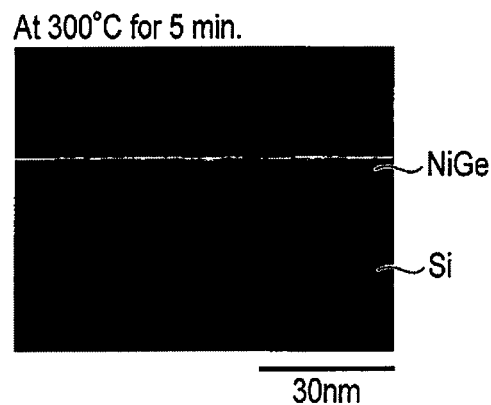
F I G. 4A
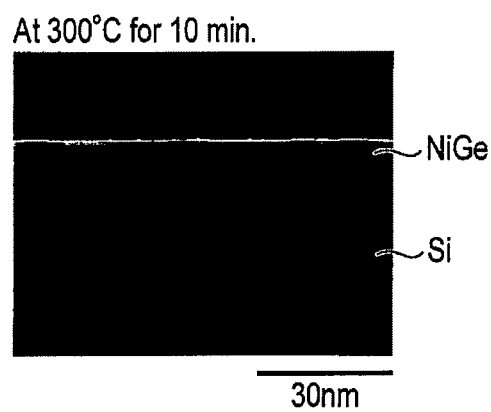
F I G. 4B
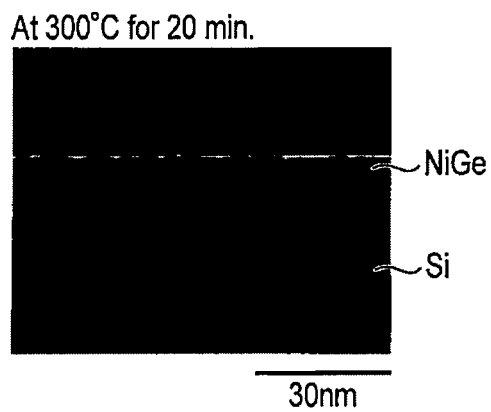
F I G. 4C

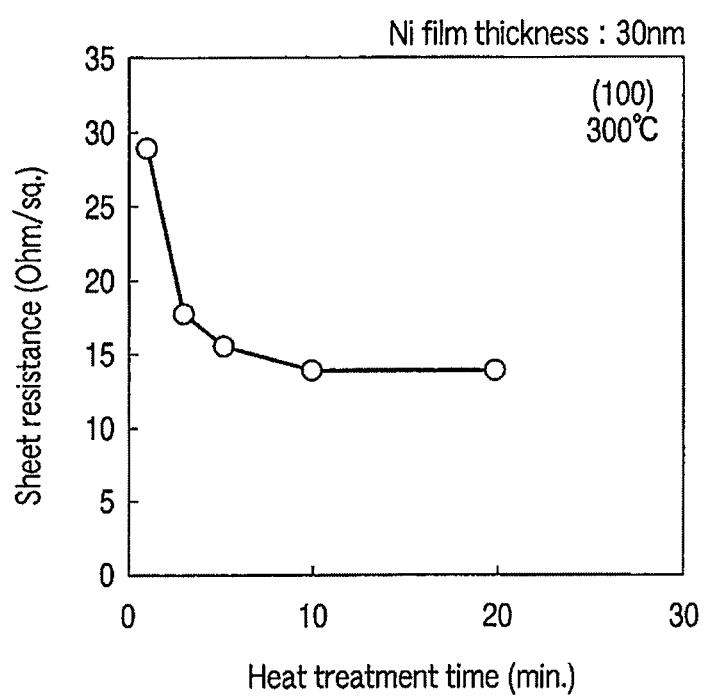
F I G. 5

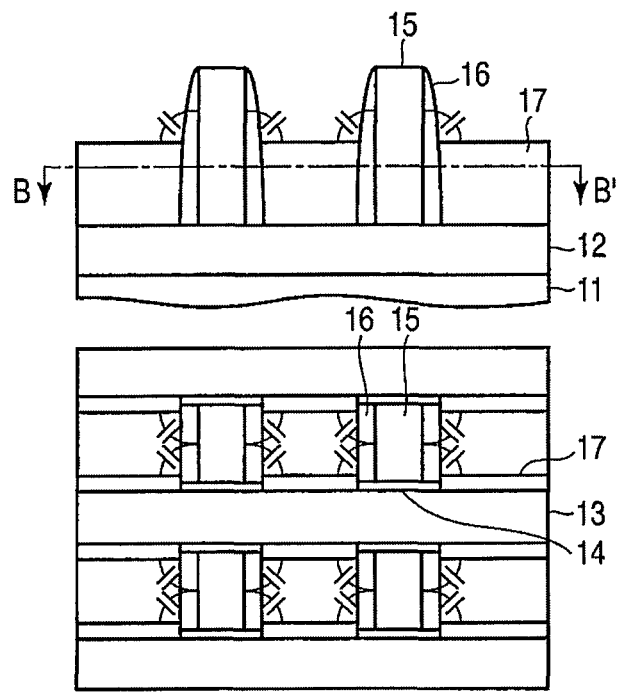
FIG. 6A
FIG. 6B
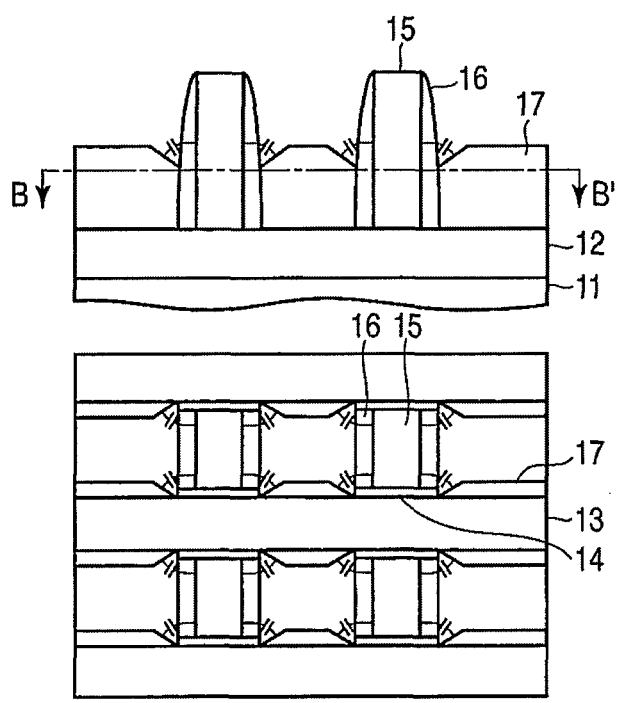
FIG. 7A
FIG. 7B

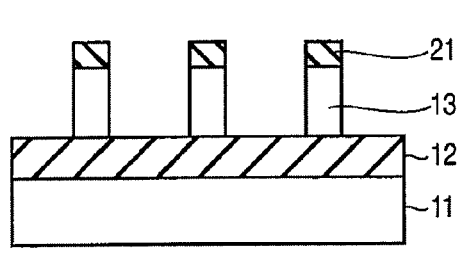
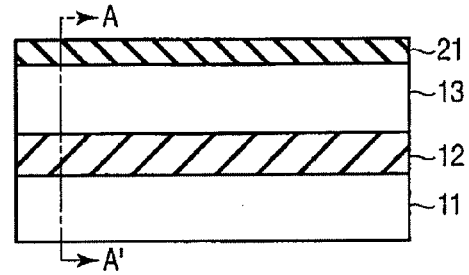
F I G. 9A   F I G. 9B
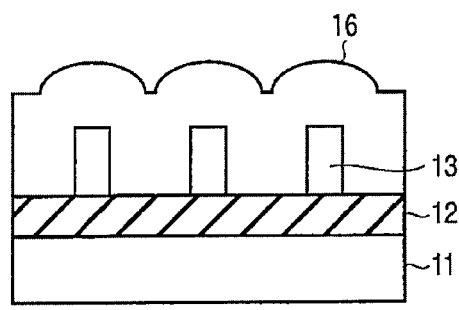
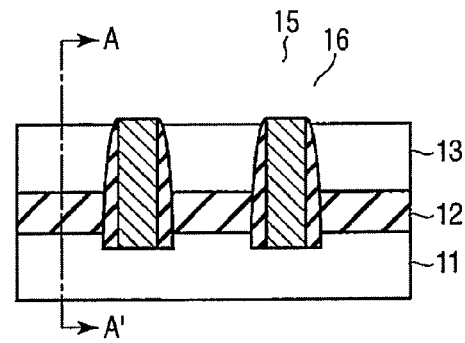
F I G. 10A   F I G. 10B
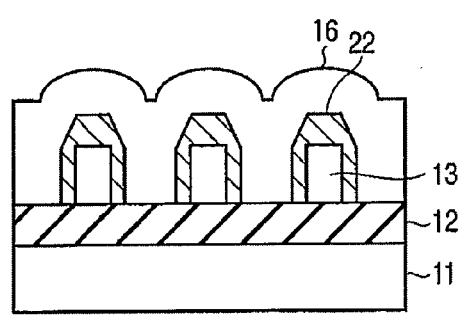
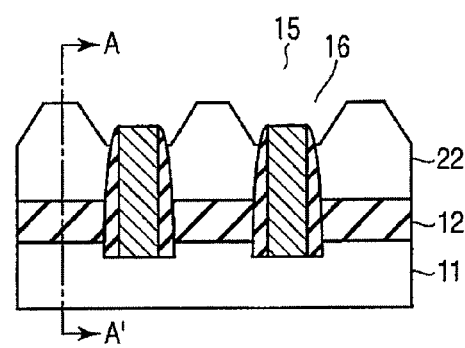
F I G. 11A   F I G. 11B

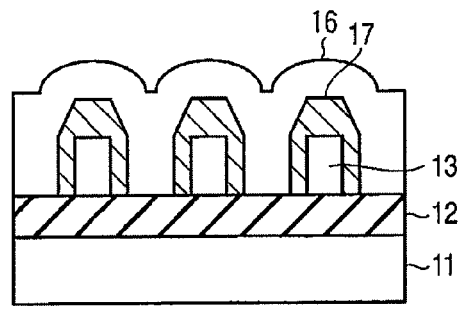
F I G. 12A
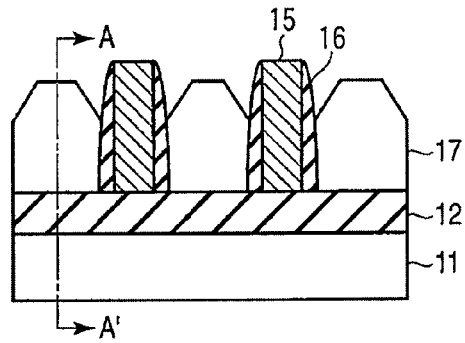
F I G. 12B
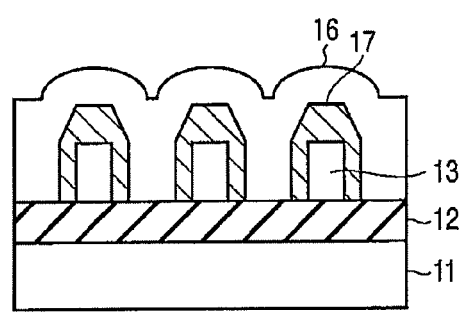
F I G. 13A
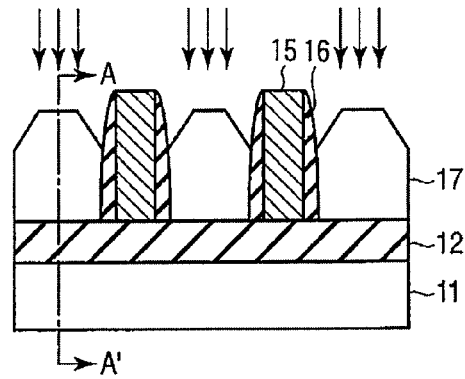
F I G. 13B

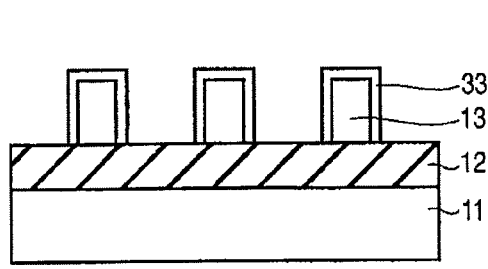
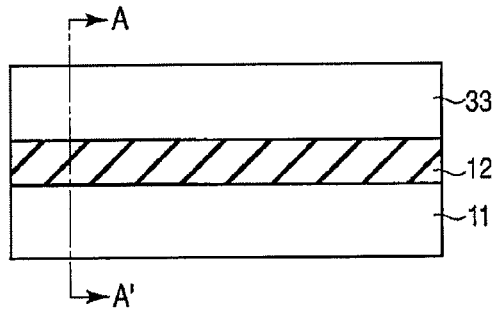
FIG. 15A  FIG. 15B
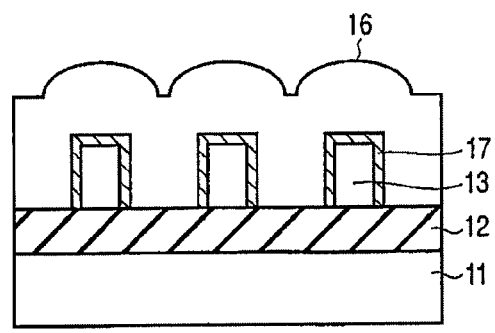
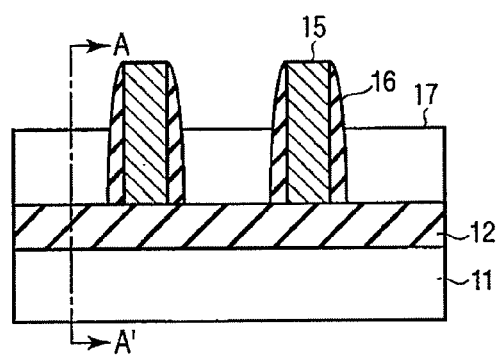
FIG. 16A  FIG. 16B

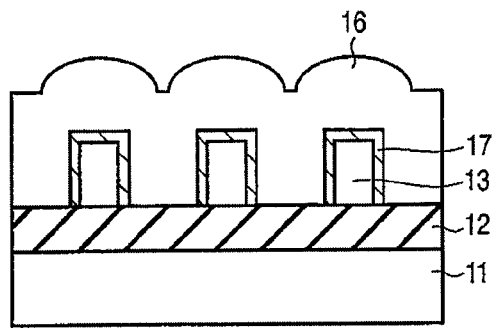
F I G. 17A
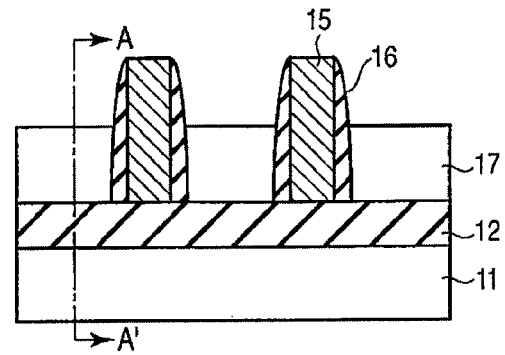
F I G. 17B
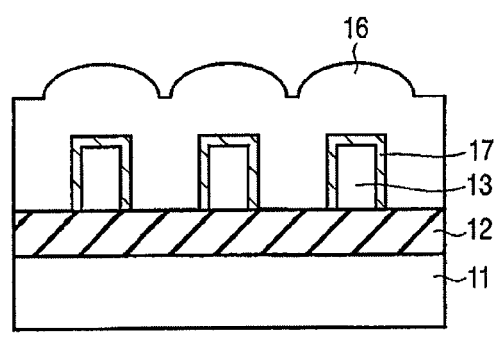
F I G. 18A
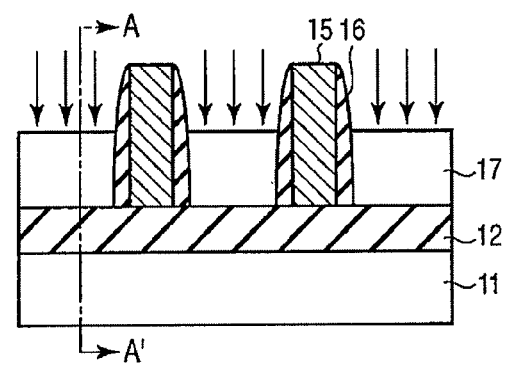
F I G. 18B

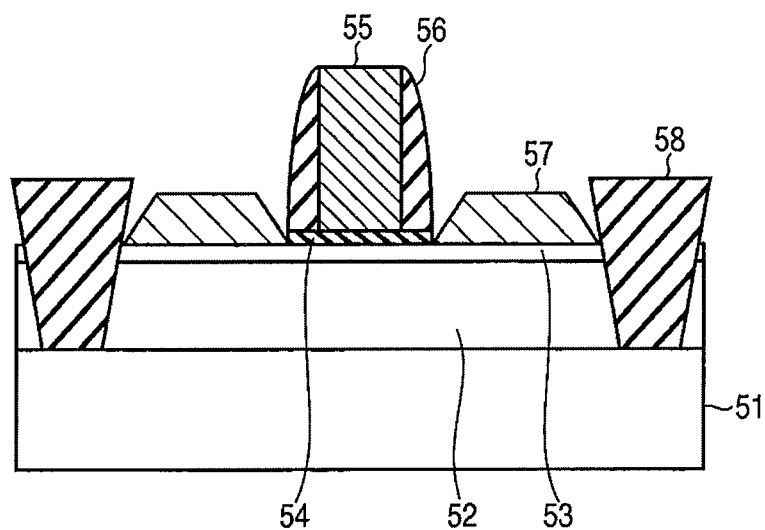
F I G. 19

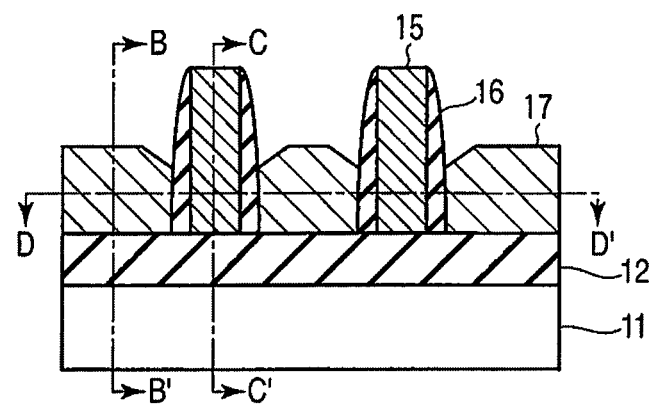
F I G. 21A
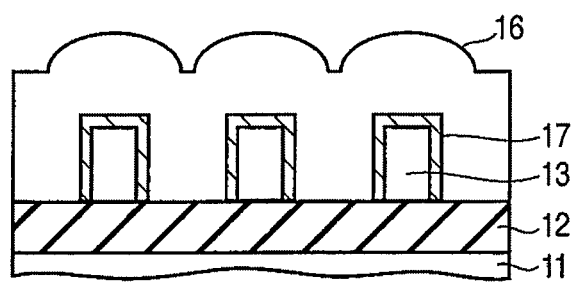
F I G. 21B
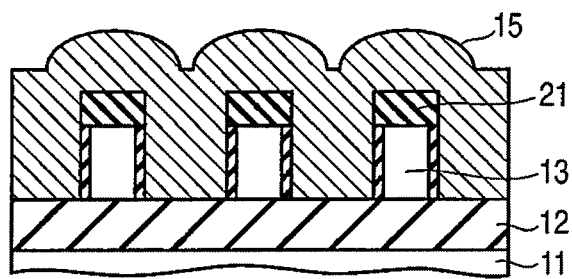
F I G. 21C
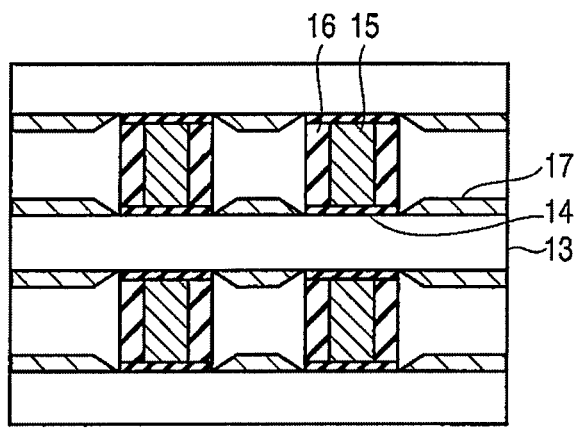
F I G. 21D

SEMICONDUCTOR DEVICE AND METHOD OF MANUFACTURING THE SAME

CROSS-REFERENCE TO RELATED APPLICATIONS

This application is a Continuation Application of PCT Application No. PCT/JP2009/066162, filed Sep. 16, 2009, the entire contents of which are incorporated herein by reference.

FIELD

Embodiments described herein relate generally to a MOS semiconductor device in which an intermetallic compound is formed in the source/drain (S/D) region, and to a method of manufacturing the semiconductor device.

BACKGROUND

In the step of forming the S/D region in a 3D-structured MOSFET, representative examples of which are a fin-FET and a tri-gate MOSFET, it has become increasingly difficult to ensure the controllability of. the profile of impurities ion-injected and to re-crystallize the thin-film fin rendered amorphous.

To solve this problem, a metal S/D-MOSFET has been proposed, which can be manufactured, without the necessity of injecting ions in such a high dose as would render the thin-film fin amorphous (see, for example, Jpn. Pat. Appln. KOKAI Publication No. 2006-100600). In this metal S/D-MOSFET, the S/D region and the extension region consist of silicide (e.g., NiSi or Ni(Pt)Si). However, the overlap length for which the extension region overlaps the gate has not been positively controlled, though the overlap length is important because it determines the current-drive and immunity tohort-channel-effect of the MOSFET.

Further, it is difficult to control the diffusion of Ni in the S/D region, because of the amount of nickel (Ni) deposited, the temperature changes during the reaction, and the like. Particularly in any region where the fin width is 30 nm or less, it is very hard to control the thickness of the silicide film. Because of this problem, the fin body may be completely changed to silicide. If the fin body is completely changed to silicide, the current path extending from the channel to the drain region consisting of silicide is restricted. It causes inevitably increasing parasitic resistance and greatly degrading the current-drive. Moreover, in any system using SOI, abnormal growth or condensation locally occurs because of the thermal gradient resulting from the low thermal conductivity of the BOX layer. This makes it extremely difficult to control the thickness of the silicide film and the overlap length.

BRIEF DESCRIPTION OF THE DRAWINGS

FIGS. 2A to 2D are photo-micrographs showing the relationship between the heat treatment temperature and the state of germanium compound being formed;

FIG. 3 is a diagram showing the relationship between the heat treatment temperature and sheet resistance;

FIGS. 4A to 4C are photo-micrographs showing the relationship between the heat treatment time and the state of germanium compound being formed;

FIG. 5 is a diagram showing the relationship between the heat treatment time and sheet resistance;

FIGS. 6A and 6B are sectional views showing how a silicide layer is formed on an Si layer;

FIGS. 7A and 7B are sectional views showing the shape of a germanide layer formed on an Si layer;

FIGS. 9A and 9B are sectional views explaining a step of manufacturing the MOSFET according to the first embodiment;

FIGS. 10A and 10B are sectional views explaining a step of manufacturing the MOSFET according to the first embodiment;

FIGS. 11A and 11B are sectional views explaining a step of manufacturing the MOSFET according to the first embodiment;

FIGS. 12A and 12B are sectional views explaining a step of manufacturing the MOSFET according to the first embodiment;

FIGS. 13A and 13B are sectional views explaining a step of manufacturing the MOSFET according to the first embodiment;

FIGS. 15A and 15B are sectional views explaining a step of manufacturing the MOSFET according to the third embodiment;

FIGS. 16A and 16B are sectional views explaining a step of manufacturing the MOSFET according to the third embodiment;

FIGS. 17A and 17B are sectional views explaining a step of manufacturing the MOSFET according to the third embodiment;

FIGS. 18A and 18B are sectional views explaining a step of manufacturing the MOSFET according to the third embodiment;

FIG. 19 is a sectional view schematically showing the structure of a MOSFET according to a fifth embodiment;

FIGS. 21A to 21D are sectional views showing the structure of a MOSFET according to another modified embodiment.

DETAILED DESCRIPTION

In general, according to one embodiment, a method of manufacturing a MOS-type semiconductor device is provided. In the method, a gate electrode is formed on a gate insulating film provided on a channel region which is a part of an Si layer and which is interposed between a source/drain region, and a film mainly comprising of Ge is made to grow on the source/drain region. Then, and the film mainly comprising of Ge is made to react with a metal, forming an intermetallic compound film having a depthwise junction position identical to a growth interface of the film mainly comprising of Ge.

Embodiments will be described in detail, with reference to the accompanying drawings.

(First Embodiment)

This embodiment is a tri-gate MOSFET formed by injecting impurities into a silicon-on-insulator (SOI) substrate. The SOI substrate has an SOI layer having a thickness of, for example, 50 nm.

To achieve the object described above, Ge or SiGe containing high concentration of Ge is epitaxially grown on an extension region and an S/D region. Then, as in the conventional method, Ni is deposited on the SiGe layer and a heat treatment is performed, achieving germanidation. That is, an intermetallic compound is formed. The difference in Ni diffusion coefficient between the Ge and Si and the difference between the germanide-forming temperature and the silicide forming temperature are utilized to perform selective forming of germanide. The metal S/D region and the extension region are thereby controlled. The unreacted part of Ni is removed with HCl solution. This method solves the problem of completely changing the fin body to silicide, ultimately decreasing the parasitic resistance.

Figure 1A:
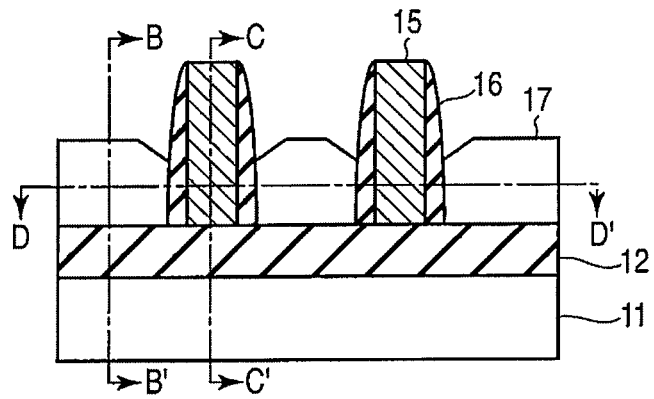
FIGS. 1A to 1D are sectional views schematically showing the structure of a MOSFET according to a first embodiment.
Figure 1B:
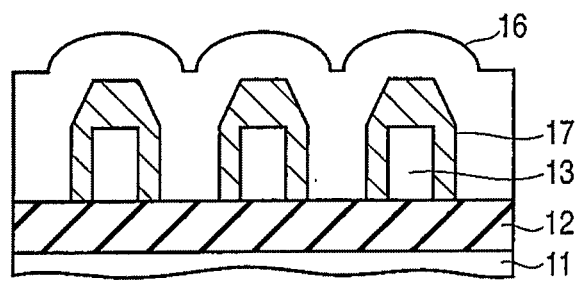
Figure 1C:
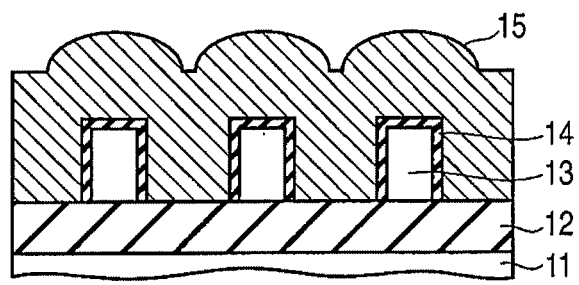
Figure 1D:
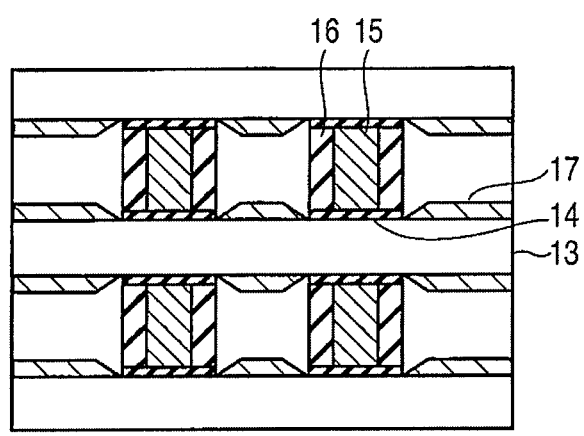

FIGS. 1A to 1D are sectional views schematically showing the structure of a MOSFET according to the present embodiment. FIG. 1A is a sectional view along the direction in which the Si fin extends. FIG. 1B is a sectional view along line B-B' in FIG. 1A. FIG. 1C is a sectional view along line C-C' in FIG. 1A. FIG. 1D is a sectional view along line D-D' in FIG. 1A. In these figures, 11 indicates a substrate supporting an SOI substrate, 12 indicates an insulating film buried in the SOI substrate, 13 indicates the Si layers of the SOI substrate, 14 indicates gate insulating films, 15 indicates gate electrodes, 16 indicates sidewall insulting films, and 17 indicate NiGe layers (intermetallic compound films).

The Si layers 13 on the SOI substrate are shaped like fins. The gate electrodes 15 extend in a direction perpendicular to the Si layers 13. The gate electrodes 15 are made of polycrystalline silicon, each covering both sides and top of Si layers 13. Further, each gate insulating film 14, which consists of, for example, silicon dioxide, is formed between one gate electrode 15 and one Si layer 13.

Two sidewall insulting films 16 consisting of, for example, silicon dioxide are formed on the sides of one gate electrode 15. A source/drain (S/D) region is formed in the Si layer 13. The source region and the drain region sandwich channel region which is surrounded by gate electrodes 15. On the surface of the S/D region, an NiGe layers 17 is formed. The NiGe layer 17 is formed on the surface of the Si layer 13 only, and its edge by the side of each gate electrode 15 has a facet determined by the plane orientation of the crystal.

The S/D region and the extension region are formed by a method in which after forming the NiGe layers 17, ions are injected into the NiGe layers 17 and activation annealing is then performed. Since the ions are injected after the NiGe layers 17 have been formed, the problem that the ions injected into the extension region may render the fins amorphous is solved. If the problem is not actualized, ion injection to the extension region can be performed before forming the NiGe layers 17.

Whichever method is used, the impurities can segregate at the NiGe/Si interface at the time of the activation annealing or the germanidation, because of NiGe and Si differ in the solubility limit and diffusion coefficient of impurities. Therefore, a junction interface having a high and precipitous activation ratio can be formed.

Through experiments, the inventors hereof have confirmed a temperature range in which a germanium compound is selectively formed on a sample comprising an Si substrate having plane orientation (100) or (110) and a Ge layer 30 nm thick formed on the Si substrate. FIG. 2A to FIG. 2D are photo-micrographs of the sample, taken as the sample was heat-treated at different temperatures.

FIG. 2A shows an Si substrate and a Ge layer formed on the Si substrate. A sample comprises the Si substrate, the Ge layer, and an Ni layer formed on the Ge layer. FIG. 2B shows the sample heat-treated at 250° C. As can be seen from FIG. 2B, Ge and Si scarcely react under the condition. FIG. 2C shows the sample heat-treated at 300° C. As can be seen from FIG. 2C, all Ge is used for germanidation and an NiGe layer is formed by reacting Ge with Ni. At this point, Ni and Si scarcely react with each other. This is because the silicidation temperature is higher than the germanidation temperature. FIG. 2D shows the sample heat-treated at 350° C. As shown in FIG. 2D, an NiGe layer is formed, and NiSi layer is formed by reacting Ni with Si. This is because the temperature rises, enabling Si and Ni to react with each other.

FIG. 3 is a diagram showing the relationship between annealing temperature and sheet resistance. The white dots show the relationship for a sample in which the Ge plane orientation is (100), and the black dots show the relationship for a sample in which the Ge plane orientation is (110). At 250° C. or less, the sheet resistance is high, particularly that of the sample having the Ge plane orientation of (100). This means that Ni and Ge scarcely react with each other. At 275° C. or more, the sheet resistance decreases. This demonstrates that Ni and Ge react with each other. If the temperature exceeds 325° C., the sheet resistance for (100) greatly decreases. This means that Ni and Si react with each other. Hence, the temperature should be within the range of 275° C. to 325° C. to make only Ge react with Ni.

Through experiments, the inventors hereof have also confirmed that a germanium compound is selectively formed at the heat-treatment temperature of 300° C., almost regardless of the heat-treatment time. FIGS. 4A to 4C are photo-micrographs of the heat-treated samples for different periods of time. The samples are same as ones identified above.

As shown in FIG. 4A, in the heat treatment performed at 300° C. for 5 minutes, the reaction of Ni and Ge proceeds and NiGe is formed. As shown in FIG. 4B, in the heat treatment performed at 300° C. for 10 minutes, the reaction of Ni and Ge further proceeds and all the Ge reacts with Ni. As shown in FIG. 4C, in the heat treatment performed at 300° C. for 20 minutes, the amount of NiGe scarcely changes and the reaction of Ni and Ge has been saturated. At this point Ni scarcely reacts with Si.

FIG. 5 is a diagram showing the relationship between the sheet resistance and the annealing time when a Ge layer of plane orientation (100) is heat-treated at 300° C. Once the annealing has started, the sheet resistance gradually decreases, and then it becomes almost constant ten minutes later. Thereafter, the sheet resistance scarcely changes even if the annealing is continued. This means that only a thin layer of Ge formed on the Si substrate reacts with Ni, whereas underlying Si does not react with Ni.

In most cases, in the manufacturing process of the fin-FET and the tri-gate MOSFET, Si is epitaxially grown upwards at the extension region in order to reduce the parasitic resistance. However, the Si layer so grown approaches the gate, inevitably resulting in a problem of increasing the fringe capacitance. That is, the decrease of the parasitic resistance and the increase of the parasitic capacitance have a trade-off relationship. The method according to this embodiment can reduce the fringe capacitance with the gate in both the fin-FET and the tri-gate MOSFET, ultimately the method solves the above-mentioned problem.

FIGS. 6A and 6B show a structure made by the conventional method, and FIGS. 7A and 7B show the structure according to this embodiment. In both structures, a silicide layer (or germanide layer) is formed on an Si layer. FIGS. 6A, 6B, 7A and 7B show the shapes of the silicide layers, and explain how fringe capacitance is generated. FIG. 6A and FIG. 7A are sectional views along the direction in which the Si layer extends. FIG. 6B is a sectional view along line B-B' in FIG. 6A. FIG. 7B is a sectional view along line B-B' in FIG. 7A.

In the conventional method, an NiSi layer 17 is formed on the entire surface of an Si layer 13 as shown in FIGS. 6A and 6B. Therefore, a part of the Si layer, which grown upwards, approaches the gate and the fringe capacitance increases.

In the method according to this embodiment, an NiGe layer 17 selectively grown in the S/D region extending from the gate edge to the S/D contact plug forms a facet. Because of this facet, as shown in FIGS. 7A and 7B, the grown film thickness is gradually thick with increasing distance from the gate edge. The fringe capacitance with the gate can therefore be decreased. That is, the facet is formed of an edge of the NiGe layer 17 which exists near the gate electrode 15. The longer the distance between the Si layer 13 and the edge of the NiGe layer 17 is, the longer the distance between the gate electrode 15 and the edge of the NiGe layer 17 is. This facet decreases the fringe capacitance with the gate.

Further, only Ge selectively grown contributes to germanidation, suppressing the increase in the parasitic resistance resulting from excessive germanidation.

Figure 8A:
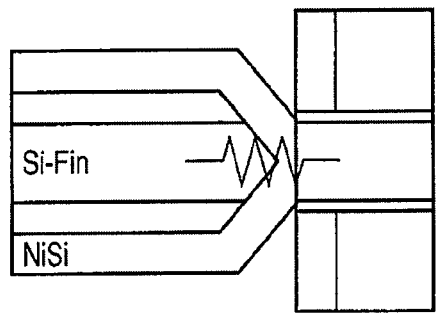
FIGS. 8A to 8C are sectional views showing the shape of an Si layer extending from an S/D region to a channel region.
Figure 8B:
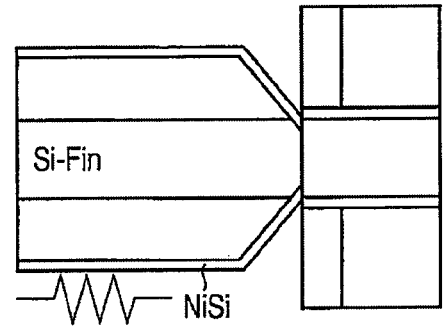

As shown in FIG. 8A, what is usually problematical with the fin-FET or the tri-gate MOSFET is a parasitic resistance increase resulting from the complete silicidation of the fin bodies in the S/D region. If the fin bodies in the S/D region are silicidated, the parasitic resistance will increase at the drain edge. If the silicide layer is made thinner in order to prevent complete silicidation of the fin bodies, the resistance will increase as shown in FIG. 8B.

In the element structure made by the method according to this embodiment, a low-resistance Si layer is left in the middle of each fin body. This can reduce the parasitic resistance at the drain edge. Moreover, in the MOSFET produced by the method described above, the selective Ge growth prior to the germanidation controls the overlap distance, $L_{ov}$ of the metal S/D region and extension region with respect to the lower part of the gate electrode. The variability of the overlap distance $L_{ov}$ in the width direction of the gate therefore decreases greatly. Note that changes in the distance $L_{ov}$ results in changes in the threshold value of the MOSFET. Therefore, the method according to this embodiment can greatly decrease the variability of the threshold value of the MOSFET.

In the fin-FET and the tri-gate MOSFET, the parasitic resistance is high because the S/D region extending from the gate edge to the S/D contact plug has a smaller volume than that of the planer MOSFET. To solve this problem, the extension region is epitaxially grown upwards in most cases. If the contact gate pitch is decreased, however, the extension region can hardly be epitaxially grown upwards. Further, the extension region so grown approaches the gate, inevitably increasing the fringe capacitance. That is, the decrease of the parasitic resistance and the increase of the parasitic capacitance have a trade-off relationship.

Figure 8C:
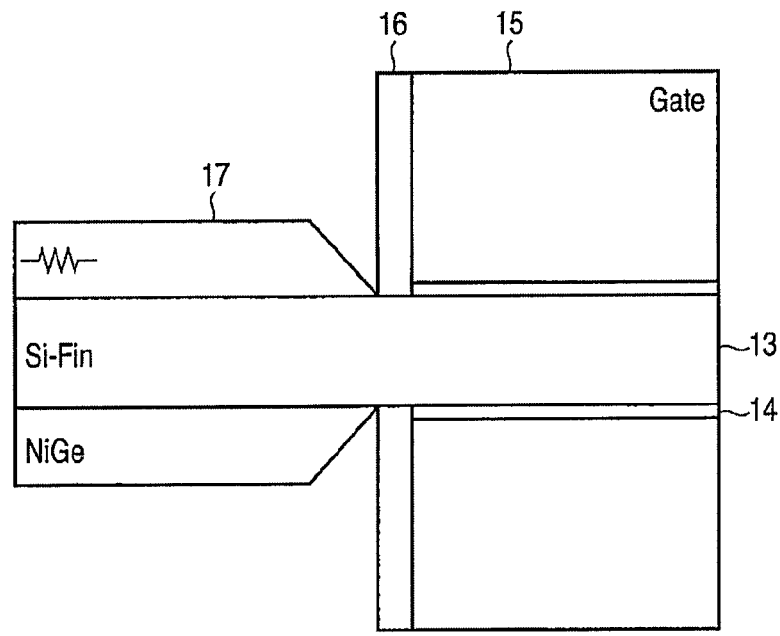

In the present embodiment, the extension region epitaxially grown upwards is 5 to 30 nm thick, which is thinner than the extension region formed by the conventional method, and a facet is formed. The grown film thickness is therefore gradually thick with increasing distance from the gate edge. Hence, the parasitic resistance can be reduced, while decreasing the fringe capacitance with the gate, owing to the self alignment. Further, only selectively grown Ge contributes to germanidation, the Si layer continuously extends from the S/D region to the channel as shown in FIG. 8C. This can suppress the increase of the parasitic resistance, which accompanies excessive silicidation.

In the metal S/D-MOSFET according to this embodiment, the increase of the parasitic resistance, which results from the upward epitaxially grown of the extension region, can be minimized, while decreasing the parasitic resistance. Moreover, the width of the side walls can be reduced, and the contacted gate pitch can therefore be decreased. In addition, since the fin structure in the S/D region is simplified, contact plugs of bar type (i.e., source and drain having merged one contact configured to contact all fin S/D regions) can be used, not contact plugs of via type (i.e., each fin having one contact configured to contact one fin S/D region).

A method of manufacturing the device according to this embodiment will be explained with reference to FIGS. 9A and 9B, to FIGS. 13A and 13B. Note that FIG. 9A to FIG. 13A are sectional views along lines A-A' in FIG. 9B to FIG. 13B, respectively.

As shown in FIG. 9A and FIG. 9B, an SOI substrate is provided. The SOI substrate includes an Si substrate (support substrate) 11, a buried insulating film 12 formed in the Si substrate 11, and an Si layer 13 formed on the buried insulating film 12. On the SOI substrate, a hard mask layer 21 consisting of nitride or oxide is formed. Thereafter, photolithography and RIE is performed for transferring a fin pattern to the hard mask layer 21. Using the hard mask layer 21 as mask, the SOI substrate is etched to the BOX layer interface. The Si layer 13 is thereby processed into a fin structure.

Next, an insulating film of $HfO_2$, $HfAl_xSiO_y$, $HfAlSiON$, $Al_2O_3$, $HfLa_xO_y$, $HfLaSiON$, $HfLaAlSiO$, $La_xAl_y$ or the like is formed as an insulating film by thermally oxidizing or nitriding SiO2, SiON, ALD or the like. Then, a gate electrode 15 is formed on a gate insulating film 14. The gate electrode 15 is a polysilicon layer, a metal layer or a laminated structure composed of these layers. The gate insulating film 14 is not shown in FIG. 10A or FIG. 10B.

Then, two gate-sidewall insulating films 16 having a thickness of, for example, 5 nm, and being a silicon oxide film, a silicon nitride film or a laminated structure composed of these films, are formed the sides of the gate electrode 15, respectively. In this state, Halo injection is performed, injecting impurities such as B, $BF_2$ or In into an nFET, and P, As or Sb into a pFET. These impurities are injected in a tilted direction, in a dose of the order of $10^{12}$ to $10^{13}$ cm$^{-2}$. The Halo injection is not absolutely necessary, and may be dispensed with.

Further, as shown in FIG. 11A and FIG. 11B, a Ge layer 22 is selectively grown to a thickness of 10 nm by, for example, CVD, in the extension region and the S/D region. Instead of the Ge layer 22, an SiGe layer may be formed to provide a so-called "elevated S/D structure."

Next, Ni is deposited to a thickness of, for example, 5 nm as shown in FIGS. 12A and 12B by means of sputtering. Heat treatment is then performed, by means of RTA, at 300° C. for 1 minute, forming an NiGe (nickel germanide) layer 17. Thereafter, chemicals are applied, removing unreacted Ni.

The NiGe layer formed by this method stops growing at the Ge/Si epitaxial interface and is thus prevented from excessively growing in the thickness and width directions. The resultant structure therefore has a uniform NiGe/Si interface. As a result, the junction leakage current can be greatly reduced.

Then, as shown in FIGS. 13A and 13B, impurities such as P or As are ion-implanted to form an nMOSFET, or impurities such as B or $BF_2$ are ion-implanted to form a pMOSFET, in a dose of the order of $10^{15}$ cm$^{-2}$ through the NiGe layer 17. Activation annealing is then performed at a low temperature of about 600° C. to diffuse the impurities in the germanide. Further, the impurities are activated at the NiGe/Si interface to form an S/D region. A transistor is thereby produced.

As described above, the ion implantation is performed after forming germanide. This solves the problem that the ions injected into the extension region may render the fins amorphous. An element (e.g., S, Yb or Al) capable modulating the height of a Schottky barrier can be injected together with the impurities, in order to control the height of the Schottky barrier formed at the NiGe/Si interface.

As stated above, in this embodiment, the layer selectively grown in the S/D region can be controlled in thickness, and the fringe capacitance can be prevented from increasing, though the layer selectively grown in the S/D region approaches the gate electrode. Hence, not only the parasitic resistance, but also parasitic capacitance can be reduced in the present embodiment. Further, the junction depth and the overlap distance of the S/D region with respect to the gate electrode can be well controlled because the thickness and shape of the NiGe layer 17 are defined at the Ge—Si interface. Still further, according to this embodiment, it can be prevented that the S/D region reacts with a metal and forms a complete intermetallic compound semiconductor. This suppresses the increase of parasitic resistance, ultimately enhancing the yield and performance of the semiconductor device.

(Second Embodiment)

This embodiment is a tri-gate MOSFET using an SOI substrate and produced by performing so-called "impurity pre-injection." The tri-gate MOSFET is similar in element structure to the device shown in FIG. 1. Therefore, only the method of manufacturing it will be explained below.

As in the first embodiment described above, a fin-structured Si layer 13 is formed as shown in FIGS. 9A and 9B, and gate insulating films 14, gate electrodes 15 and gate-sidewall insulating films 16 are formed as shown in FIGS. 10A and 10B. In this state, Halo injection is performed, injecting impurities such as B or $BF_2$ into an nMOSFET, and impurities such as P or As into a pMOSFET. These impurities are injected in a tilted direction, in a dose of the order of $10^{12}$ to $10^{13}$ cm$^{-2}$.

Then, ion injection is performed, injecting impurities such as P or As into the nMOSFET, and impurities such as B or $BF_2$ into the pMOSFET, in a tilted direction, in a dose of the order of $10^{15}$ cm$^{-2}$. Activation annealing is then performed. The ion injection and the activation annealing need not be performed at this point. They may be performed only after the Ge epitaxial growth. At the time of injecting the source and drain impurities, an element (e.g., S, Yb or Al) capable modulating the height of a Schottky barrier can be injected in order to control the height of the Schottky barrier formed at the NiGe/Si interface.

Next, as shown in FIGS. 11A and 11B, a Ge layer 22 is selectively grown to a thickness of 10 nm by, for example, CVD, in the extension region and the S/D region. Then, ion injection is performed, injecting impurities such as P or As into the nMOSFET, and impurities such as B or $BF_2$ into the pMOSFET, in a tilted direction, in a dose of the order of $10^{15}$ cm$^{-2}$, and activation annealing is then performed. At this point, the ion injection and the activation annealing need not be performed by all means. They may be performed only after the Ge epitaxial growth.

Then, as shown in FIGS. 12A and 12B, the unreacted part of Ni is removed in the same way as in the first embodiment.

The NiGe layer formed by this method stops growing at the Ge/Si epitaxial interface and is thus prevented from excessively growing in the thickness and width directions. The resultant structure therefore has a uniform NiGe/Si interface. As a result, the junction leakage current can be greatly reduced. While the germanide is being so formed, the impurities are diffused in the germanide. The germanide is thereby segregated at the NiGe/Si interface, whereby a transistor is formed.

Thus, this embodiment has an element structure in which a low-resistance Si layer is left in the center of the fin body. The parasitic resistance can therefore be lowered at the drain edge. In addition, the variability of the overlap distance $L_{ov}$ of the S/D region and extension region with respect to the lower part of the gate electrode greatly decreases in the width direction of the gate. This can reduce the variability in the threshold value of the MOSFET. Further, since a facet is formed, a structure which reduces the parasitic resistance and the fringe capacitance with the gate can be formed owing to the self-alignment. Still further, only Ge selectively grown contributes to germanidation. Therefore, increasing the parasitic resistance caused by excessive silicidation can be suppressed.

This embodiment can thus achieve the same advantage as the first embodiment, though the impurities are injected before the S/D region is formed.

(Third Embodiment)

This embodiment is a Ge channel tri-gate MOSFET using an SOI substrate. The SOI substrate has an SOI layer that is, for example, 50 nm thick.

Figure 14A:
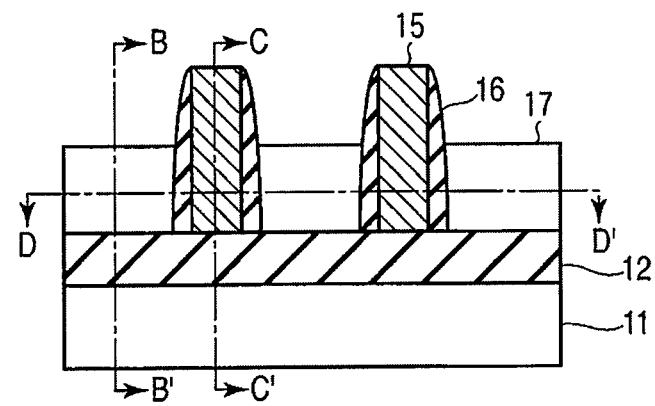
FIGS. 14A and 14D are sectional views explaining the steps of manufacturing the MOSFET according to a third embodiment.
Figure 14B:
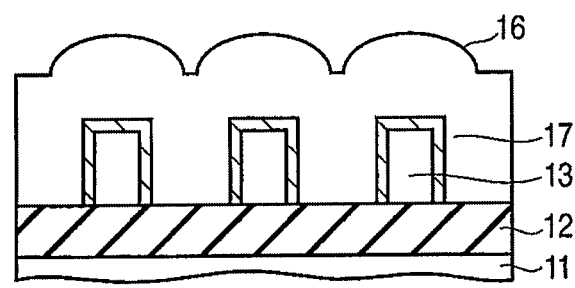
Figure 14C:
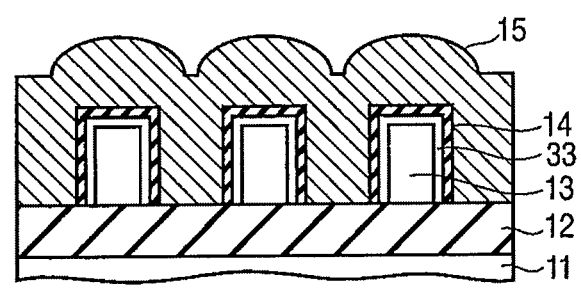
Figure 14D:
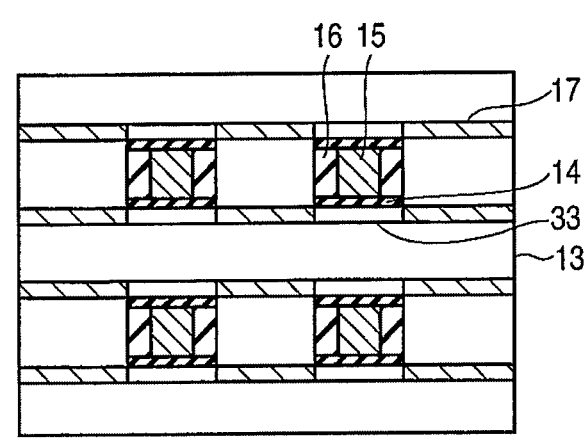
Figure 20A:
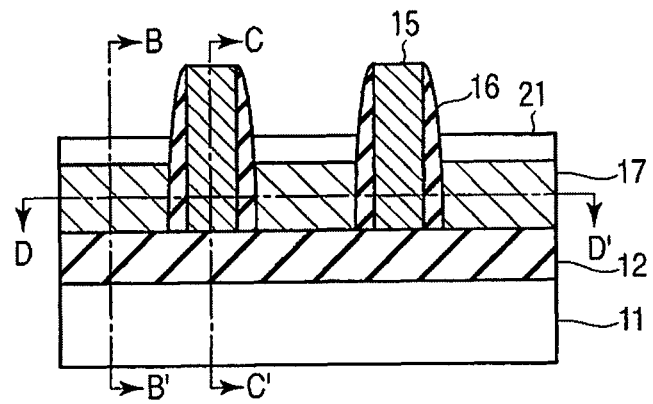
FIG. 20A to 20D are sectional views showing the structure of a MOSFET according to a modified embodiment.
Figure 20B:
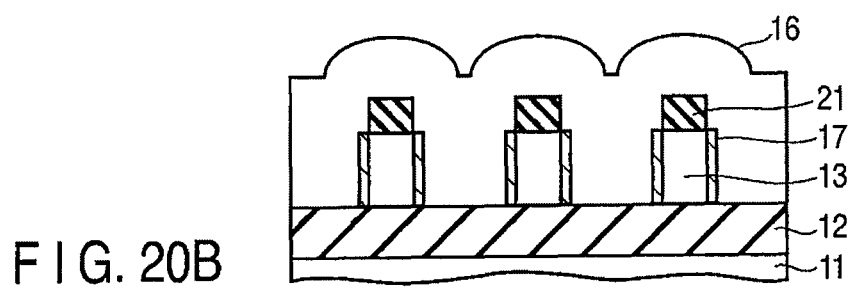
Figure 20C:
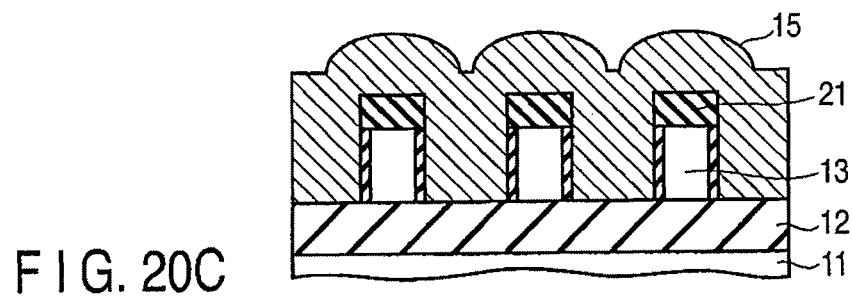
Figure 20D:
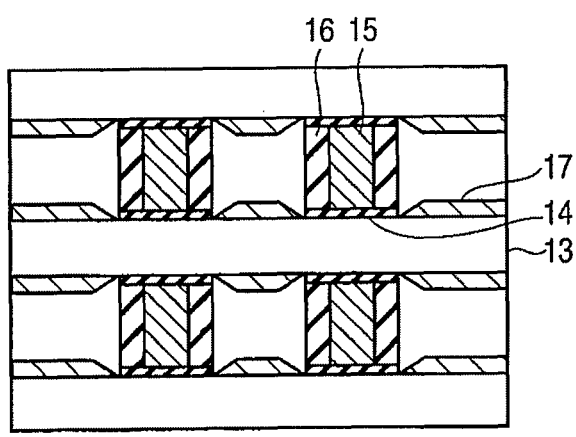

FIGS. 14A to 14D are sectional views explaining the steps of manufacturing the MOSFET according to a third embodiment. FIG. 14A is a sectional view along the direction in which Si fins extend. FIG. 14B is a sectional view along line B-B' in FIG. 14A. FIG. 14C is a sectional view along line C-C' in FIG. 14A. FIG. 14D is a sectional view along line D-D' in FIG. 14A. The parts identical to those shown in FIGS. 1A to 1D are designated by the same reference numbers and will not be described in detail.

This embodiment differs from the first embodiment described above, in that one Ge layer 33 is formed on the channel region of each Si layer 13. That is, the Ge layer 33 is formed on the channel region of the Si layer 13, a gate insulating film 14 is formed on the Ge layer 33, and a gate electrode 15 is formed on the gate insulating film 14.

On the sides of each gate electrode 15, gate insulating films 16 are formed. In each Si layer 13, a source/drain region is formed, sandwiching the channel region of the Ge layer 33 that is surrounded by the gate electrode 15. On the surface of the source/drain region, an NiGe layer 17 is formed. The NiGe layer 17 is formed only on the exposed part of the Si layer 13, and the channel region is a Ge layer 33.

A method of manufacturing the device according to this embodiment will be explained with reference to FIGS. 15A and 15B, to FIGS. 18A and 18B. Note that FIG. 15A to FIG. 18A are sectional views along lines A-A' in FIG. 15B to FIG. 18B, respectively.

First, as shown in FIG. 9A and FIG. 9B, a hard mask layer 21 is formed on the SOI substrate as in the first embodiment. Then, the SOI substrate is etched to the BOX layer interface by using the hard mask layer 21. The Si layer 13 is thereby processed into a fin structure.

Next, as shown in FIGS. 15A and 15B, the hard mask layer 21 is removed. Then, a Ge layer 33 is selectively grown to a thickness of 10 nm by, for example, CVD on the entire surface of the Si layer 13.

Then, as shown in FIG. 16A and 16B, an insulating film of $HfO_2$, $HfAl_xO_y$, $Al_2O_3$, $La_2O_3$, $La_xAl_yO$ or the like is formed as an insulating film or gate insulating film 14 by thermally oxidizing or nitriding $SiO_2$, SiON, ALD or the like. Further, a gate electrode 15 made of polysilicon, metal or laminated structure composed of these materials, is formed on the gate insulating film 14. The gate insulating film 14 is not shown in FIGS. 16A and 16B.

Further, two gate-sidewall insulating films 16 having a thickness of, for example, 5 nm, and being a silicon oxide film, a silicon nitride film or a laminated structure composed of these films, are formed the sides of the gate electrode 15, respectively. In this state, Halo injection is performed, injecting impurities such as B, BF$_2$ or In into an nMOSFET, and P, As or Sb into a pMOSFET, in a tilted direction, in a dose of the order of $10^{12}$ to $10^{13}$ cm$^{-2}$. The Halo injection is not absolutely necessary, and may be dispensed with. Thereafter, a Ge layer 22 is selectively grown to a thickness of 10 nm by, for example, CVD, in the S/D region. This epitaxial growth can be dispensed with.

Next, Ni is deposited to a thickness of, for example, 10 nm as shown in FIGS. 17A and 17B by means of sputtering. Heat treatment is then performed, by means of RTA, at 300° C. for 1 minute, forming an NiGe layer 17. Thereafter, chemicals are applied, removing unreacted Ni.

The NiGe layer 17 formed by this method stops growing at the Ge/Si epitaxial interface and is thus prevented from excessively growing in the thickness and width directions. The resultant structure therefore has a uniform NiGe/Si interface. As a result, the junction leakage current can be greatly reduced.

Then, as shown in FIGS. 18A and 18B, impurities such as P or As are ion-implanted into the nMOSFET, or impurities such as B or BF$_2$ are ion-implanted into the pMOSFET, in a dose of the order of $10^{15}$ cm$^{-2}$ through the NiGe layer. Activation annealing is then performed at a low temperature of about 600° C., diffusing the impurities in the germanide. Further, the impurities are activated at the NiGe/Si interface to produce a transistor.

As described above, the ion implantation is performed after forming germanide. This solves the problem that the ions injected into the extension region may render the fins amorphous. An element (e.g., S, Yb or Al) capable modulating the height of a Schottky barrier can be injected together with the source and drain impurities, in order to control the height of the Schottky barrier formed at the NiGe/Si interface.

Since the final structure of this embodiment is essentially identical to that of the first embodiment, it achieves advantages similar to those of the first embodiment. That is, this embodiment has an element structure in which a low-resistance Si layer is left in the center of the fin body and the parasitic resistance can therefore be lowered at the drain edge. Moreover, the change of the overlap distance L$_{ov}$ can be greatly decreased. Further, a structure that reduces the parasitic resistance, while decreasing the fringe capacitance with the gate, can be formed in self-alignment. Still further, the increase of the parasitic resistance, which accompanies excessive silicidation, can be suppressed.

In addition, the channel mobility can be more enhanced than the Si channel in this embodiment, because the Ge layer 33 is formed on the surface of the Si layer 13 and is used as channel.

(Fourth Embodiment)

This embodiment is a Ge channel tri-gate MOSFET using an SOI substrate. This tri-gate MOSFET is similar in element structure to the device shown in FIG. 14. Therefore, only the method of manufacturing it will be explained below.

Ge is deposited on the entire surface of an Si layer 13 to a thickness of 10 nm by, for example, CVD, as shown in FIGS. 15A and 15B, after processing the Si layer 13 into a fin structure, as in the method of manufacturing the third embodiment.

Then, gate insulating films 14, gate electrodes 15 and gate-sidewall insulating films 16 are formed. In this state, Halo injection is performed, injecting impurities such as B, BF$_2$ or IN into an nMOSFET, and impurities such as P, As or Sb into a pMOSFET, in a tilted direction, in a dose of the order of $10^{12}$ to $10^{13}$ cm$^{-2}$.

Further, ion injection is performed, injecting impurities such as P or As into the nMOSFET, and impurities such as B or BF$_2$ into the pMOSFET, in a tilted direction, in a dose of the order of $10^{15}$ cm$^{-2}$. Activation annealing is then performed. The ion injection and the activation annealing need not be performed at this point. They may be performed after the Ge epitaxial growth. At the time of injecting the source and drain impurities, an element (e.g., S, Yb or Al) capable modulating the height of a Schottky barrier can be injected in order to control the height of the Schottky barrier formed at the NiGe/Si interface.

Next, a Ge layer 22 is selectively grown to a thickness of 10 nm by, for example, CVD, in the extension region and the S/D region. Note that this growth of Ge is not absolutely necessary. Then, ion injection is performed, injecting impurities such as P or As into the nMOSFET, and impurities such as B or BF$_2$ into the pMOSFET, in a dose of the order of $10^{15}$ cm$^{-2}$, and activation annealing is performed. However, extension injection and the activation annealing need not be performed at this point. They may be performed only before the Ge epitaxial growth.

Then, Ni is deposited to a thickness of, for example, 5 nm as shown in FIGS. 17A and 17B by means of sputtering. Heat treatment is then performed, by means of RTA, at 300° C. for 1 minute, forming an NiGe layer 17. Thereafter, chemicals are applied, removing unreacted Ni.

The NiGe layer 17 formed by this method stops growing at the Ge/Si epitaxial interface and is thus prevented from excessively growing in the thickness and width directions. The resultant structure therefore has a uniform NiGe/Si interface. As a result, the junction leakage current can be greatly reduced. While germanide is being formed, the impurities are diffused in the germanide. The germanide is thereby segregated at the NiGe/Si interface, whereby a transistor is formed.

Thus, this embodiment has an element structure in which a low-resistance Si layer is left in the center of the fin body. The parasitic resistance can therefore be lowered at the drain edge. In addition, the change of the overlap distance L$_{ov}$ of the S/D region and extension region with respect to the lower part of gate electrode greatly decreases in the width direction of the gate. This can reduce the change in the threshold value of the MOSFET. Further, a structure is formed, in which the parasitic resistance can be reduced, while decreasing the fringe capacitance with the gate, owing to the self-alignment. Still further, only Ge selectively grown contributes to germanidation, suppressing the increase of the parasitic resistance, which accompanies excessive silicidation. Hence, this embodiment can achieve the same advantage as the third embodiment.

(Fifth Embodiment)

FIG. 19 is a sectional view schematically showing the structure of a planer MOSFET according to a fifth embodiment. In FIG. 19, 51 indicates an Si substrate of SOI structure, 52 indicates a buried insulating film of SOI, 53 indicates an Si layer of SOI, 54 indicates a gate insulating film, 55 indicates a gate electrode, 56 indicates gate-sidewall insulating films, 57 indicates an NiGe layer, and 58 indicates an element-isolation insulating film.

On the Si substrate 51, the buried insulating film 52 is formed, on which the Si layer 53 is formed. On the Si layer 53 of the SOI substrate, a gate insulating film 54 consisting of, for example, silicon oxide is formed, on which the gate electrode 55 made of, for example, polysilicon is formed. On the sides of the gate electrode 55, the gate-sidewall insulating films 56 consisting of, for example, silicon oxide are formed.

A source/drain region is formed, sandwiching the channel region below the gate electrode 55 and gate-sidewall insulating films 56. On the surface of the S/D region, an NiGe layer 57 is formed. The NiGe layer 57 is formed only on the exposed part of the Si layer 53. At its edge contacting the gate electrodes 55, the NiGe layer 57 has a facet determined by the plane orientation of the crystal.

To manufacture a MOS transistor according to this embodiment, after the gate insulating film 54, gate electrodes 55 and gate-sidewall insulating films 56 are formed, a Ge layer is formed on the exposed surface of the Si layer 53 and is heat-treated in the same condition as in the first embodiment, thereby. forming the NiGe layer 57. At this point, the NiGe layer 57 stops growing at the Ge/Si epitaxial interface, and is prevented from excessively growing in the thickness and width directions. The resultant structure therefore has a uniform NiGe/Si interface. Thus, Ge can contribute to germanidation, without causing silicidation of the Si layer 53. Moreover, the fringe resistance with respect to the gate electrode 55 can be reduced because the NiGe layer 57 has a facet.

Hence, not only the parasitic resistance, but also parasitic capacitance can be reduced in the present embodiment. That is, this embodiment achieves the same advantage as the first embodiment.

(Modified Embodiment)

The present invention is not limited to the embodiments described above. The first to fourth embodiments have been described as tri-gate MOSFETs. Nonetheless, the invention can be applied to a fin-FET, too. For example, the mask layer 21 for forming an Si fin may be left even after the Si fin has been formed. Then, the gate electrode 15 will be formed only at both sides of the Si fin, via the gate insulating films 14. As a result, a fin-FET is produced. Alternatively, as shown in FIGS. 21A to 21D, the mask layer 21 may be removed from the S/D region only. Also in this case, the gate electrode 15 is formed at only both sides of the Si fin, via the gate insulating films 14, whereby a fin-FET is produced.

In the embodiments described above, a Ge layer is formed on the S/D region. Nonetheless, the Ge layer may be replaced by a layer the main component of which is Ge (e.g., layer having Ge concentration of 70% or more). An SiGe layer having a high Ge concentration, for example, may be formed. In this case, SiGe indeed reacts with a metal such as Ni, forming an intermetallic compound. The junction position the intermetallic compound film assumes in the depth direction can, however, be set at the SiGe—Si epitaxial interface. It is desired that the layer formed on the S/D region be 5 to 30 nm thick, whether it consists of Ge or SiGe.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a MOS semiconductor device, comprising:

forming a gate electrode on a gate insulating film provided on a channel region which is a part of an Si layer and which is interposed between a source/drain region;

growing a film comprising Ge, on the source/drain region;

making the film comprising Ge react with a metal, thereby forming an intermetallic compound film having a depth-wise junction position identical to a growth interface of the film comprising Ge, and injecting ions into the intermetallic compound film to form the source/drain region, and injecting ions of an element capable of modulating the height of a Schottky barrier into the intermetallic compound film.

2. The method of claim 1, wherein the film comprising Ge is selectively formed on the source/drain region after the gate electrode has been formed.

3. The method of claim 1, wherein the film comprising Ge is formed on the source/drain region before the gate electrode is formed.

4. The method of claim 1, wherein Ni is used as a metal to react with the film comprising Ge, and germanidation of Ge and Ni is performed at a temperature ranging from 275 to 325° C.

5. The method of claim 1, wherein the Si layer has plane orientation (100) or (110).

6. The method of claim 1, wherein an SiGe film is used as the film comprising Ge.

7. A method of manufacturing a 3D-structured MOS semiconductor device, comprising:

forming a gate electrode on a gate insulating film provided on a channel region which is a fin-shaped part of an Si layer formed on a substrate and which is interposed between a source/drain region;

growing a film comprising Ge, on the source/drain region;

making the film comprising Ge react with a metal, thereby forming an intermetallic compound film having a depth-wise junction position identical to a growth interface of the film comprising Ge, and injecting ions into the intermetal compound film to form the source/drain region in, and injection ions of an element capable of modulating the height of a Schottky barrier into the intermetallic compound film.

8. The method of claim 7, wherein the film comprising Ge is selectively formed on the source/drain region after the gate electrode has been formed.

9. The method of claim 7, wherein the film comprising Ge is formed on the source/drain region before the gate electrode is formed.

10. The method of claim 7, wherein Ni is used as a metal to react with the film comprising Ge, and germanidation of Ge and Ni is performed at a temperature ranging from 275 to 325° C.

11. The method of claim 7, wherein the Si layer has plane orientation (100) or (110).

12. The method of claim 7, wherein an SiGe film is used as the film comprising Ge.

* * * * *